United States Patent
Chang et al.

(10) Patent No.: US 8,354,890 B2
(45) Date of Patent: Jan. 15, 2013

(54) SYSTEMS AND METHODS FOR REDUCING FREQUENCY PULLING IN AN OSCILLATOR CIRCUIT

(75) Inventors: Yuyu Chang, Irvine, CA (US); John Leete, Huntington Beach, CA (US); Walid Ahmed, Tinton Falls, NJ (US); Wei Luo, Marlboro, NJ (US)

(73) Assignee: Broadcom Corporation, Irvine, CA (US)

( * ) Notice: Subject to any disclaimer, the term of this patent is extended or adjusted under 35 U.S.C. 154(b) by 27 days.

(21) Appl. No.: 12/914,235

(22) Filed: Oct. 28, 2010

(65) Prior Publication Data

US 2012/0068780 A1 Mar. 22, 2012

Related U.S. Application Data

(60) Provisional application No. 61/385,435, filed on Sep. 22, 2010.

(51) Int. Cl.
*H03B 1/00* (2006.01)
*H03B 5/32* (2006.01)

(52) U.S. Cl. ..................... 331/74; 331/158; 331/177 V

(58) Field of Classification Search ............... 331/74, 331/175, 177 V, 36 C, 116 R, 116 FE, 158
See application file for complete search history.

(56) References Cited

U.S. PATENT DOCUMENTS

| 7,123,113 B1 * | 10/2006 | Brennan et al. ............... 331/158 |
| 2001/0000426 A1 * | 4/2001 | Sung et al. ...................... 331/25 |
| 2009/0021311 A1 * | 1/2009 | Grewing et al. ................ 331/34 |

* cited by examiner

*Primary Examiner* — Ryan Johnson
(74) *Attorney, Agent, or Firm* — Sterne, Kessler, Goldstein & Fox PLLC

(57) ABSTRACT

Methods and systems are provided to calibrate an oscillator circuit to reduce frequency pulling as a result of a change in power to a portion of the oscillator circuit. In an embodiment, an oscillator is coupled to a clock buffer circuit and a tuning capacitor configured to tune a frequency of the oscillator to a baseline frequency required for cellular communications. A change in power to the clock buffer circuit initiates a change in an amount of capacitance seen by the oscillator, which negatively impacts the tuning of the oscillator. A register stores a frequency offset caused by the change in power, and the tuning capacitor is adjusted, using the frequency offset, in response to the change in power, such that the total amount of capacitance seen by the oscillator is not changed when the change in power occurs.

22 Claims, 5 Drawing Sheets

SYSTEMS AND METHODS FOR REDUCING FREQUENCY PULLING IN AN OSCILLATOR CIRCUIT

CROSS REFERENCE TO RELATED APPLICATIONS

This application claims the benefit of U.S. Provisional Application No. 61/385,435, filed Sep. 22, 2010, entitled "SYSTEMS AND METHODS FOR REDUCING FREQUENCY PULLING IN AN OSCILLATOR CIRCUIT," which is incorporated herein by reference in its entirety.

BACKGROUND OF THE INVENTION

1. Field of the Invention

This invention relates to cellular communications and specifically to frequency calibration in cellular devices.

2. Background

Cellular systems typically have a stringent frequency requirement to enable them to provide a very accurate frequency reference to radio systems.

Previous cellular devices experience frequency shifts when internal signals are turned on or off. These frequency shifts interfere with optimal operation of the cellular devices.

What is needed are methods and systems for enabling a cellular device to continue to operate at an optimal frequency when internal signals experience a change in power.

BRIEF DESCRIPTION OF THE DRAWINGS/FIGURES

The accompanying drawings, which are incorporated in and constitute part of the specification, illustrate embodiments of the invention and, together with the general description given above and the detailed descriptions of embodiments given below, serve to explain the principles of the present invention. In the drawings.

Figure 1:
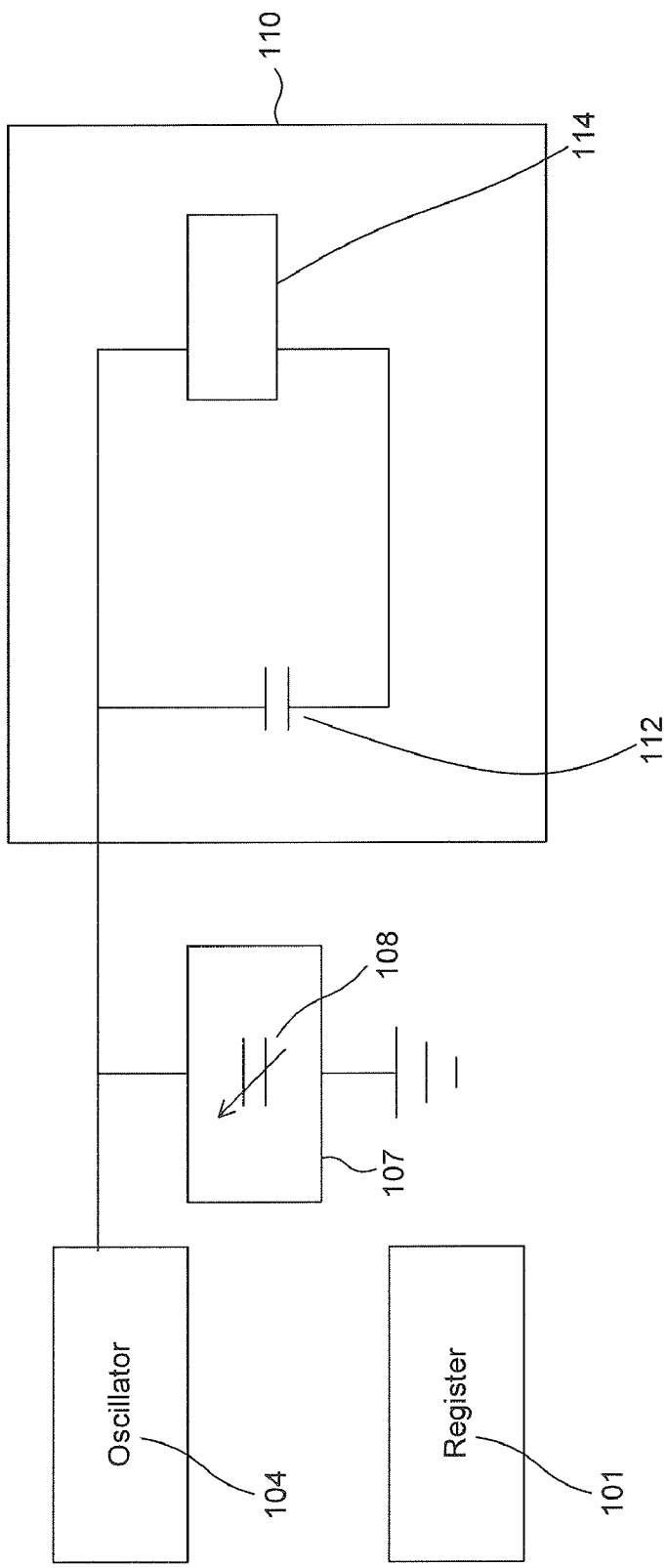
FIG. 1 is a diagram of an embodiment of an oscillator circuit in accordance with the present invention.

Features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION OF THE INVENTION

1. Overview

Systems and methods are provided to reduce frequency pulling in an oscillator circuit. Oscillator circuits are used in communications devices (such as cellular devices) to tune the communications device to a baseline frequency required for optimal communications. The baseline frequency is typically set for the oscillator circuit during manufacturing. One challenge is to ensure that the frequency of a communications device is not altered by a 0.01 part per million (ppm) frequency shift (corresponding to about 0.26 Hz) when a peripheral system, such as Wireless LAN (WLAN) or Bluetooth, requests a signal, such as a clock signal, from the oscillator circuit. To save power, it would be desirable to turn off clock buffers in the oscillator circuit that provide the clock signals when the clock buffers are not used.

However, turning the clock buffers on or off may shift the frequency of an oscillator circuit above 0.01 ppm due to limited isolation and bond wire and pad couplings and the effect of the on/off impedance loading by the clock buffers. Adding additional isolation stages is not an optimal solution to this issue due to the coupling from bond wires. Thus, to avoid an undesirable frequency shift, unused clock buffers in the oscillator circuit are left on, leading to an inefficient use of power.

Embodiments of the present invention ensure that the frequency of an oscillator circuit is not substantially altered by a change in power to a portion of the oscillator circuit. As a result of the systems and methods disclosed herein, clock buffers in an oscillator circuit may be advantageously powered down when unused without shifting the frequency of the oscillator circuit above 0.01 ppm, leading to an increase in power efficiency.

2. Systems

An embodiment of an oscillator circuit 100 in accordance with the present invention will now be described with reference to FIG. 1. In FIG. 1, a circuit including an oscillator 104 is coupled to a tuning circuit 107 including a capacitor 108 and a load circuit 110. At least a portion of the load circuit 110 includes an element 112 having a capacitance. In an embodiment, the element 112 is a second capacitor. In another embodiment, the element 112 represents an induced capacitance when additional circuitry 114 is powered on. In an embodiment, additional circuitry 114 includes a power source and a clock buffer. In an embodiment, the capacitor 108 is a variable capacitor configured to tune a frequency of the oscillator 104 to a baseline frequency required for optimal operation of the oscillator circuit 100. In another embodiment, the capacitor 108 is a bank of capacitors.

Whenever a change in power occurs in the load circuit 110, the capacitance of the element 112 changes. For example, in an embodiment, element 112 may be inactive when the additional circuitry 114 is off but may have an induced capacitance when the additional circuitry 114 is powered on. As a result, the total capacitance seen by the oscillator 104 changes in response to the change in power in the load circuit, which negatively impacts the tuning of the oscillator 104, and therefore the frequency of the oscillator circuit 100 deviates from the baseline frequency. A lower capacitance seen by the oscillator 104 shifts the oscillator frequency higher, and a higher capacitance seen by the oscillator 104 shifts the oscillator frequency lower. Typically, the change in power occurs, for example, if additional circuitry 114 is powered down or powered up. However, it should be understood that any change in power may cause a change in capacitance seen by the oscillator 104 (for example, if the additional circuitry 114 is changed from a higher power state to a lower power state, such as a standby mode).

The system of FIG. 1 is configured to compensate for this deviation from the baseline frequency responsive to the change in power in the load circuit 110. In an embodiment, a change in capacitance seen by the oscillator 104 that occurs as a result of the change in power in the load circuit 110 is measured. A value, corresponding to the change in capacitance, is stored in a register 101 accessible by the oscillator circuit 100. When the change in power occurs again, the capacitance of the variable capacitor 108 is adjusted, using the stored value, so that the total amount of capacitance seen by the oscillator is constant when the change in power occurs. In an embodiment, a controller (not shown) monitors the load circuit 110 for a change in power (on or off). The controller may be located on-chip or off-chip and may be implemented using hardware or software. After the controller detects a change in the power of a load circuit 110, the controller initiates tuning of the variable capacitor 108 using the corresponding value stored in the register 101 so as to compensate for any change in the load capacitance 112, so that the total capacitance seen by the oscillator 104 remains relatively constant.

In another embodiment, a frequency offset that occurs as a result of the change in power in the load circuit 110 is measured. A value, corresponding to the frequency offset, is stored in a register 101 accessible by the oscillator circuit 100. When the change in power occurs again, the capacitance of the variable capacitor 108 is adjusted, using the stored value, so that the frequency of the oscillator is not substantially affected when the change in power occurs.

In an embodiment, the impact of temperature on the oscillator circuit is measured. A temperature change that occurs as a result of the change in power in the load circuit 110 is measured, along with a corresponding effect on capacitance seen by the oscillator 104 and/or a frequency offset. A value, corresponding to the change in temperature, is stored in a register 101 accessible by the oscillator circuit 100. When the change in power (and corresponding change in temperature) occurs again, the capacitance of the variable capacitor 108 is adjusted, using the stored value(s) corresponding to temperature, capacitance, and/or frequency offset, so that the tuning of the oscillator is not substantially affected when the change in power and corresponding change in temperature occurs.

In an embodiment, the measurement(s) of the change in capacitance and/or frequency offset are taken and stored in the register(s) 101 during manufacturing of the oscillator circuit 100. However, the measurement(s) may also be taken and stored on the fly, enabling the oscillator circuit 100 to be calibrated based on different and/or changing baseline frequency requirements. Further, when the measurements are taken in the field (as opposed to during manufacture), the oscillator circuit 100 can be calibrated in its actual operating environment, which may produce a different result than when the oscillator circuit is calibrated in a manufacturing environment.

An exemplary operation of the oscillator circuit 100 will now be described with reference to FIG. 1. For example, if the capacitance seen by the oscillator 104 increases as a result of the change in power, an amount of the capacitance increase seen by the oscillator 104 is measured and stored as the value, and the capacitance of the variable capacitor 108 is decreased by the value whenever the change in power occurs. If the capacitance seen by the oscillator 104 decreases as a result of the change in power, an amount of the capacitance decrease seen by the oscillator 104 is measured and stored as the value, and the capacitance of the variable capacitor 108 is increased by the value whenever the change in power occurs.

In an embodiment, multiple frequency offsets, changes in capacitance seen by the oscillator 104, and/or temperature values, corresponding respectively to different levels of power of the load circuit 110, may be measured and stored. For example, a first value may be measured and stored when the additional circuitry 114 in the load circuit 110 is in an off-state, and a second value may be measured and stored when the additional circuitry 114 in the load circuit 110 is in an on-state. The variable capacitor 108 is then modified accordingly using the value corresponding to the current state of the additional circuitry 114. As a result, the capacitance of the variable capacitor is adjusted by an appropriate amount whenever the change in power occurs, which causes the capacitance seen by the oscillator 104 to remain constant and enables the oscillator circuit 100 to continue operating at the baseline frequency.

In another embodiment, three values may be measured and stored: (1) a first value corresponding to an on-state of the additional circuitry 114; (2) a second value corresponding to an off-state of the additional circuitry 114; and (3) a third value corresponding to a standby state of the additional circuitry 114. The variable capacitor 108 is then modified accordingly using the value corresponding to the current state of the additional circuitry 114. While stored values for 1, 2, and 3 states are discussed herein, it is contemplated that several differing amounts of power in the load circuit 110 may affect variable capacitor 108. Thus, any number of values corresponding to the differing amounts of power in the load circuit 110 may be measured and stored so that the variable capacitor 108 may be modified responsive to the changes in power, with the goal of maintaining a constant total capacitance (108+112) that is seen by the oscillator 104 so as to maintain a stable oscillator frequency. Additionally, it is contemplated that variable capacitor 108 may be modified using an algorithm depending on a level of power in the load circuit 110.

Figure 2:
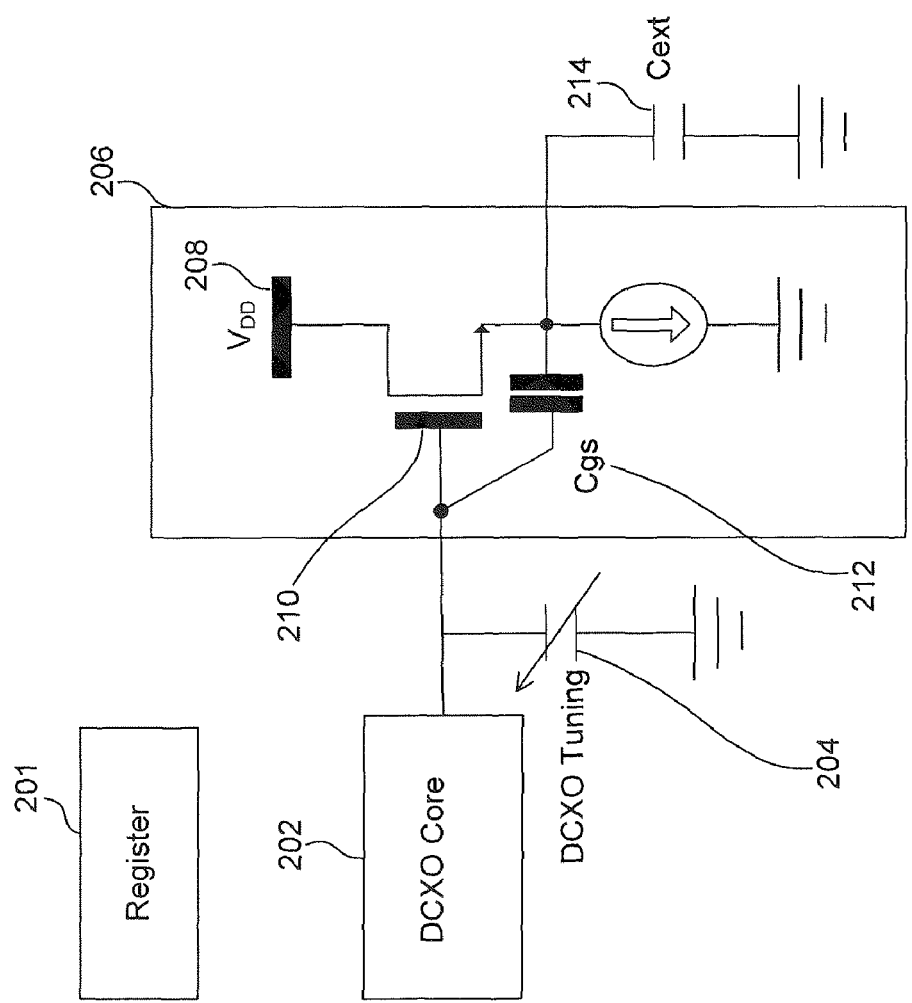
FIG. 2 is a diagram of an embodiment of an oscillator circuit of a communications device in accordance with the present invention.

Another embodiment of an oscillator circuit 200 of a communications device in accordance with the present invention will now be described with reference to FIG. 2. In FIG. 2, a first circuit including a Digitally Compensated Crystal Oscillator (DCXO) core 202 is coupled to a variable capacitor 204 used to tune the DCXO core 202 to a baseline frequency required for cellular communications with a base station. In an embodiment, DCXO core 202 comprises two cross-coupled field effect transistors (FETs) that oscillate at a frequency determined by the variable capacitor 204. In an embodiment, the oscillator circuit 200 may also comprise an external capacitor ($C_{ext}$) 214.

The oscillation of the DCXO core 202 produces a clock signal, which is buffered by a clock buffer circuit 206 coupled to the DCXO core 202. The clock buffer circuit 206 includes (or is coupled to) a voltage source 208 and a transistor 210. When the clock buffer circuit 206 is powered from an off-state to an on-state via a change in voltage source 208, a capacitance between the transistor gate and source ($C_{gs}$) 212 is altered. As indicated, the capacitance is typically a gate to source capacitance or some other capacitance associated with the transistor 210. The change in capacitance in $C_{gs}$ affects the total capacitance seen by the DCXO core 202, which negatively impacts the tuning of the DCXO core 202. In other words, the oscillation frequency of the DCXO core 202 can change due the variation in total capacitance seen by the DCXO core 202.

To compensate for the change in capacitance seen by the DCXO core 202 caused when the clock buffer circuit is powered on, a value corresponding to the change in capacitance seen by the DCXO core 202 (such as a frequency offset or a capacitance difference) is stored in a register 201 accessible by the oscillator circuit 200 and/or the communications device. The oscillator circuit 200 and/or the communications device is configured to alter the capacitance value of the variable capacitor 204 using the stored value when the clock buffer circuit 206 is powered on so as to compensate for capacitance variation seen by the DCXO core 202. Accordingly, using the system of FIG. 2, the clock buffer circuit 208 may be advantageously powered down while unused without substantially impacting the functionality of the DCXO core 202, and the DXCO core 202 continues to operate at the baseline frequency required for cellular communications with the base station regardless of the power state of the clock buffer circuit 208.

For example, in an embodiment, the communications device (and/or the oscillator circuit) accesses code that instructs the communications device (and/or the oscillator circuit) to decrease the capacitance of the variable capacitor 204 by an amount corresponding to the stored value when the clock buffer circuit 206 is powered on and to increase the capacitance of the variable capacitor 204 to the previous level once the clock buffer circuit is powered off. In an embodiment, the register 201 and/or the code may be implemented and/or stored on the same chip as the oscillator circuit and/or the communications device. In another embodiment, the register 201 and/or the code may be implemented and/or stored on a separate device accessible by the oscillator circuit and/or the communications device.

Figure 3:
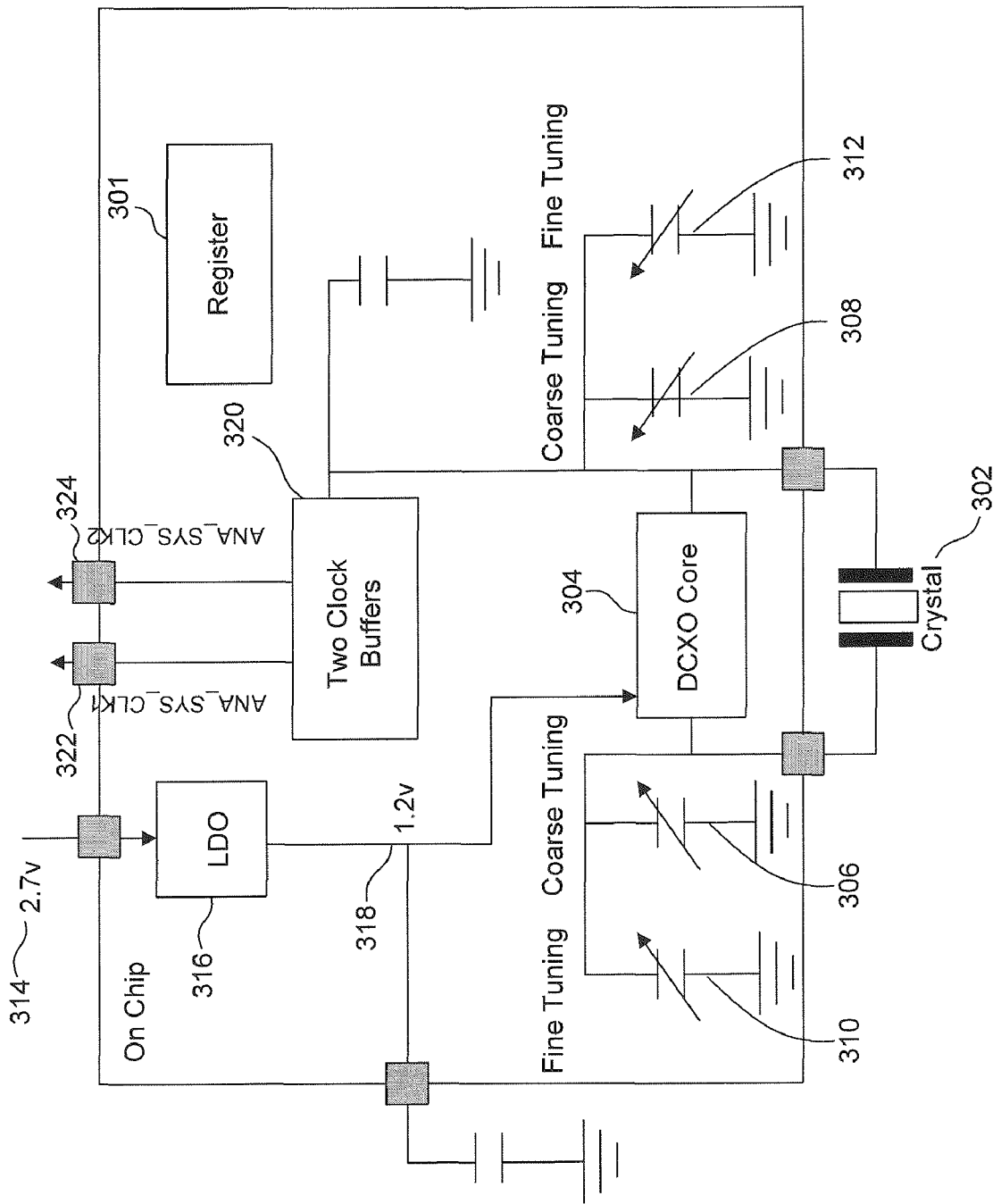
FIG. 3 is a diagram of an embodiment of an oscillator circuit of a cellular device in accordance with the present invention.

Another embodiment of an oscillator circuit 300 of a cellular device in accordance with the present invention will now be described with reference to FIG. 3. In FIG. 3, the oscillator circuit 300 is implemented as a system on a chip. In FIG. 3, a crystal 302 is coupled to a DXCO core 304. In an embodiment, the crystal 302 comprises a vibrating crystal of piezoelectric material. The DCXO core 304 is tuned using a series of capacitor banks and/or varactor diodes (306, 308, 310, and 312) comprised of capacitors (and/or varactor diodes) for coarse tuning (306 and 308) and fine tuning (310 and 312) so that the DCXO core 304 creates an electric signal at a precise frequency required for cellular communications with a base station. The oscillator circuit 300 receives power 314 via a low dropout regulator (LDO) 316 that maintains a constant output voltage 318 that is input to the DCXO core 304. Two clock buffers 320 are coupled to the DCXO core 304. The clock buffers 320 produce clock signals 322 and 324 that are output when requested (e.g., by WLAN, Bluetooth, or GPS).

In an embodiment, the clock buffers 320 include capacitors or elements that have an induced capacitance when the clock buffers are powered on. When the clock buffers 320 are powered from an off-state to an on-state to produce clock signals 322 and 324, a change in the capacitance of the clock buffers 320 causes a change in the total amount of capacitance seen by the DCXO core 304. As a result, the DCXO core 304 deviates from the optimal baseline frequency required for cellular communications. To compensate for this undesired frequency pulling, a frequency offset (or a change in capacitance seen by the DCXO core 304) that occurs in response to the change in power of the clock buffers is measured and stored in a register 301. This register 301 may be located on-chip or off-chip.

Two clock buffers 320 are shown in FIG. 3. In an embodiment, a different frequency shift occurs when each clock buffer is powered on. Therefore, in an embodiment, a different frequency offset (or a change in capacitance seen by the DCXO core 304) is measured when each clock buffer is turned on and is stored in the register 301. Additionally, a third frequency offset (or a change in capacitance seen by the DCXO core 304) is measured and stored when both clock buffers are turned on. The variable capacitors in the tuning capacitor banks (306, 308, 310, and/or 312) are modified, using the stored values, based on which clock buffer(s) are turned on. The oscillator circuit 300 is thus advantageously configured to enable either or both of the clock buffers to be switched on or off without causing a corresponding frequency pulling effect on the DCXO core 304, leading to an increased power efficiency.

In an embodiment, a controller (not shown) monitors the clock buffers 320 and/or requests for clock signals 322 and 324. The controller may be located on-chip or off-chip and may be implemented using hardware or software. After the controller detects a change in the power of the clock buffers 320 (or after the controller detects a request for clock signal 322 or 324), the controller initiates tuning of the variable capacitors in the tuning capacitor banks (306, 308, 310, and/or 312).

While two clock buffers 320 are shown in FIG. 3, it is contemplated that any number of clock buffers may be used in an oscillator circuit in accordance with the present invention. It is further contemplated that any number of values, corresponding respectively to any combination of clock buffers being powered on or off, may be measured and stored so that capacitors (306, 308, 310, and/or 312) used to tune an oscillator may be modified accordingly when the clock buffers 320 are powered on or off. For example, in an oscillator circuit having three clock buffers, a different change in capacitance seen by the DCXO core 304 may be observed depending on which clock buffer(s) are turned on. Thus, values may be measured and stored for each possible combination of the on/off-states of the three clock buffers: (1) when each clock buffer is powered on (while the other two clock buffers are off); (2) when two clock buffers are powered on (while the other clock buffer is off); and/or (3) when all three clock buffers are powered on. Additionally, as discussed above, it is contemplated that values may be measured and stored for differing levels of power for the clock buffers (e.g., for a standby mode), and it is further contemplated that the capacitor banks (306, 308, 310, and/or 312) may be modified according to an algorithm taking into consideration which clock buffers are activated and/or the level of power of each clock buffer.

3. Methods

Figure 4:
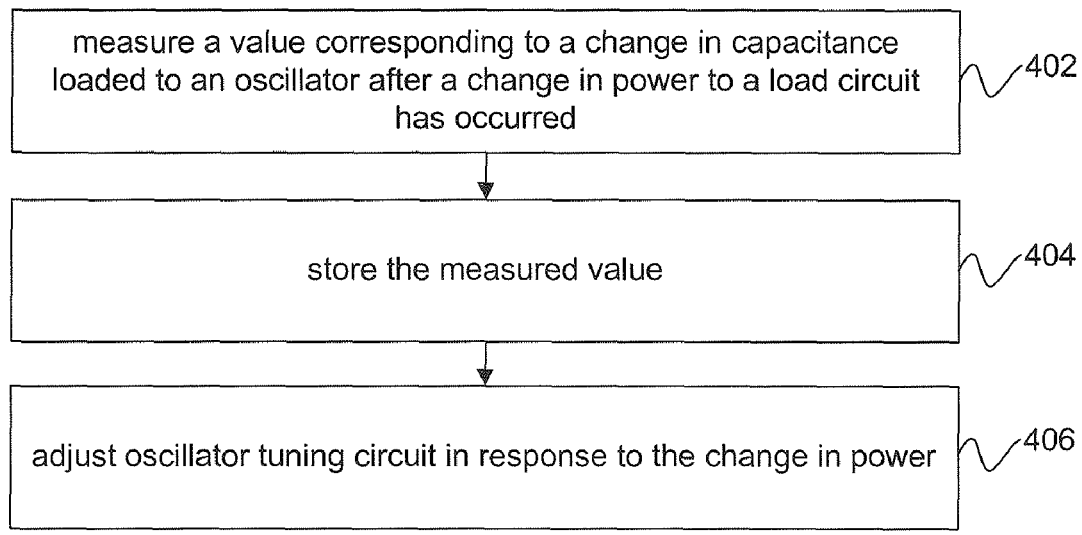
FIG. 4 is a flowchart of a method of reducing frequency pulling in an oscillator circuit in accordance with an embodiment of the present invention.

A method 400 of reducing frequency pulling in an oscillator circuit, in accordance with an embodiment of the present invention, will now be described with reference to FIG. 4 and FIG. 1. After a change in power has occurred in a load circuit 110, a value corresponding to a change in capacitance seen by an oscillator is measured 402. In an embodiment, the value is a frequency offset. In another embodiment, the value is a difference in capacitance seen by the oscillator 104 caused by the change in power, and the stored value is subtracted from the capacitance of the oscillator tuning circuit 107 to adjust the oscillator tuning circuit 107 in response to the change in power.

After the value is measured 402, the measured value is then stored 404. When the change in power occurs again in the load circuit 110, the oscillator tuning circuit 107 is adjusted 406 with the stored value so that the oscillator 104 does not experience a significant frequency pulling effect. In other words, the frequency offset that occurs when the power is changed can be retrieved, and used to tune one or more tunable capacitances in the tuning circuit 107 coupled to the oscillator 104, so as to counter-act the frequency offset and maintain a stable frequency despite the power change in the load circuit. The method 400 described above advantageously allows the load circuit 110 to be turned off when unused without negatively impacting the tuning of the oscillator 104, leading to an increased power efficiency of the oscillator circuit 100.

In an embodiment, the load circuit is a clock buffer circuit including a capacitor. In an embodiment, the oscillator circuit 100 receives a request for a clock signal, and the clock buffer circuit is powered from an off-state to an on-state to transmit the requested clock signal. Alternatively, the load circuit may be powered to or from a standby mode. In another embodiment, the effect of temperature on the oscillator circuit 100 is also measured. A value corresponding to the change in temperature in the oscillator tuning circuit 107 caused by the change in power in the load circuit 110 is measured and stored. The capacitance of the tuning circuit 107 is then adjusted in response to the change in power in the load circuit 110 and/or the change in temperature.

Figure 5:
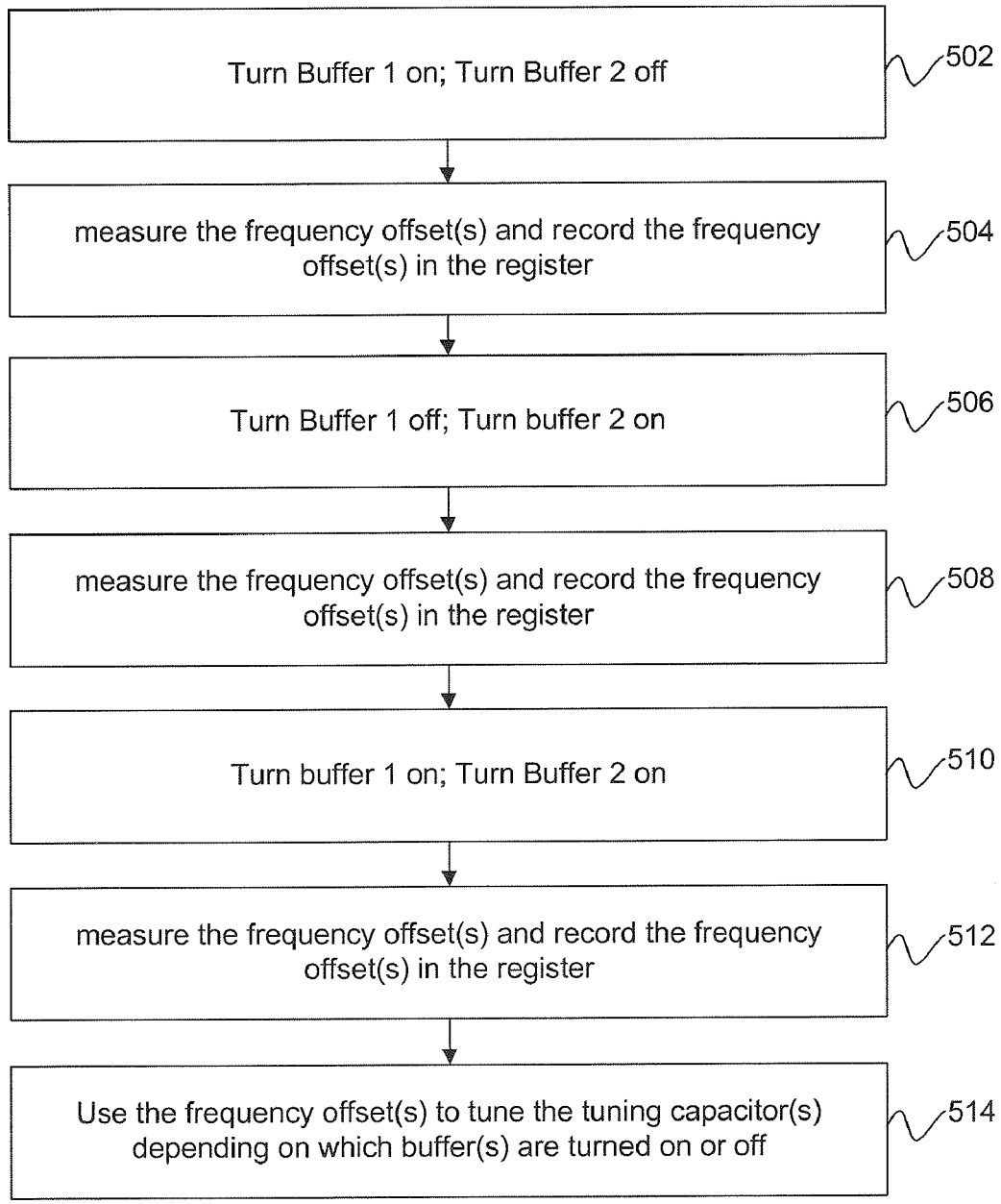
FIG. 5 is a flowchart of a method of reducing frequency pulling in an oscillator circuit of a cellular device in accordance with an embodiment of the present invention.

Another method 500 of reducing frequency pulling in an oscillator circuit of a cellular device, in accordance with an embodiment of the present invention, will now be described with reference to FIG. 5 and FIG. 3. In FIG. 3, the oscillator circuit 300 is implemented as a system on a chip having two clock buffers 320. Each clock buffer is powered on to produce a corresponding requested clock signal (322 and 324), and the powering on of each clock buffer has a different frequency pulling effect on the DCXO core 304. Thus, to reduce frequency pulling on the DCXO core 304, a frequency pulling effect is measured and recorded when each clock buffer is turned on and when both clock buffers are turned on.

In step 502, clock buffer 1 is turned on, and clock buffer 2 is turned off. In step 504, the frequency offset(s) caused by the change in power are measured and recorded in a register 301. In step 506, clock buffer 1 is turned off, and clock buffer 2 is turned on. In step 508, the frequency offset(s) caused by the change in power are measured and recorded in the register 301. In step 510, both clock buffers 1 and 2 are turned on. In step 512, the frequency offset(s) caused by the change in power are measured and recorded in the register 301. In step 514, after these three frequency offsets have been measured and stored, during operation, a respective frequency offset is accessed by the cellular device and/or oscillator circuit 300 and used to adjust the tuning capacitor(s) depending on which buffer(s) are turned on or off, so that the DCXO core 304 is not significantly impacted by frequency pulling when the clock buffers are turned on or off. As discussed above, it is contemplated that any number of clock buffers 320 and/or load circuits 110 may be present in an embodiment of the present invention. It is further contemplated that any number of power levels and/or modes may be used for the clock buffers 320 and/or load circuit(s) 110 and that an algorithm may be used to modify the capacitance value of a tuning capacitor(s) (108, 308, and 312) accordingly. Further, as discussed above, the register 301 may be implemented and/or stored on the same chip as the oscillator circuit 300 and/or cellular device or at a separate location accessible by the oscillator circuit 300 and/or cellular device.

4. Conclusion

The above systems and methods may be implemented as a computer program executing on a machine, as a computer program product, or as a tangible and/or non-transitory computer-readable medium having stored instructions.

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

What is claimed is:

1. An oscillator circuit comprising:
    an oscillator having an oscillation frequency;
    a plurality of clock buffer circuits coupled to an output of the oscillator, including;
        a first clock buffer circuit, wherein a first change in power to the first clock buffer circuit in the plurality of clock buffer circuits causes a first frequency offset in the oscillator frequency, and
        a second clock buffer circuit, wherein a second change in power to the second clock buffer circuit causes a second frequency offset in the oscillator frequency;
    a register configured to store the first frequency offset and the second frequency offset; and
    a tuning capacitor coupled to the oscillator, wherein the tuning capacitor is configured to tune the oscillation frequency of the oscillator to a desired baseline frequency, wherein the tuning capacitor is adjusted, based on the respective first and second frequency offsets, in response to the respective first and second changes in power.

2. The oscillator circuit of claim 1, wherein the oscillator is a digitally compensated crystal oscillator (DCXO) core.

3. The oscillator circuit of claim 1, wherein the first clock buffer circuit comprises a clock buffer capacitor, wherein the first change in power to the first clock buffer circuit initiates a change in capacitance of the clock buffer capacitor, and wherein the change in capacitance of the clock buffer capacitor initiates the change in the oscillation frequency of the oscillator.

4. The oscillator circuit of claim 1, wherein the first clock buffer circuit is changed from an off-state to an on-state to initiate the first change in power.

5. The oscillator circuit of claim 1, wherein the first clock buffer circuit is changed from an off-state to a standby state or from a standby state to an on-state to initiate the first change in power.

6. The oscillator circuit of claim 1, wherein the register is further configured to store a temperature value caused by the first change in power, and wherein the tuning capacitor is adjusted, using the temperature value, in response to the first change in power.

7. The oscillator circuit of claim 1, wherein the register is further configured to store a third frequency offset caused by a third change in the oscillation frequency of the oscillator, wherein the third change in the oscillation frequency is initiated by the first change in power and the second change in power, and wherein the tuning capacitor is adjusted, using the third frequency offset, in response to the first change in power and the second change in power.

8. The oscillator circuit of claim 1, further comprising a controller, wherein the controller is configured to:
    detect a request for a first clock signal from the first clock buffer circuit; and
    initiate tuning of the oscillation frequency in response to detecting the request for the first clock signal.

9. An oscillator circuit comprising:
    an oscillator having an oscillation frequency;

a plurality of clock buffer circuits coupled to the oscillator including a first clock buffer circuit and a second clock buffer circuit;

a register configured to:
store a first value corresponding to a first change in capacitance, of the first clock buffer circuit in the plurality of clock buffer circuits, seen by the oscillator, wherein the first change in capacitance is initiated by a first change in power to the first clock buffer circuit, and store a second value corresponding to a second chance in capacitance, of the second clock buffer circuit, seen by the oscillator, wherein the second change in capacitances initiated by a second change in power to the second clock buffer circuit; and a tuning circuit coupled to the oscillator, wherein the tuning circuit is configured to tune the oscillation frequency of the oscillator to a desired baseline frequency, wherein the tuning circuit is adjusted, based on the respective first and second values, in response to the respective first and second changes in power.

10. A method comprising:
measuring a first value corresponding to a first change in capacitance seen by an oscillator, wherein the first change in capacitance is initiated by a first change in power to a first portion of a load circuit, wherein the first portion includes a first clock buffer of a plurality of clock buffers coupled to the oscillator;
storing the first value;
adjusting, using the first value, an oscillator tuning circuit in response to the first change in power;
measuring a second value corresponding to a second change in capacitance seen by the oscillator, wherein the second change in capacitance is initiated by a second change in power to a second portion of the load circuit;
storing the second value; and
adjusting, using the second value, the oscillator tuning circuit in response to the second change in power.

11. The method of claim 10, wherein the first change in power is a change in power from an off-state to an on-state or from an on-state to an off-state.

12. The method of claim 11, further comprising:
receiving a request for a signal from the first clock buffer; and
transmitting the signal, using the first clock buffer, wherein the first change in power is initiated by a transmission of the signal.

13. The method of claim 12, further comprising:
changing the first clock buffer from the off-state to the on-state in response to the request for the signal; and
changing the first clock buffer from the on-state to the off-state in response to the transmission of the signal.

14. The method of claim 10, wherein the first change in power is a change in power from an off-state to a standby state or from a standby state to an on-state.

15. The method of claim 10, further comprising:
measuring a change in temperature caused by the first change in power;
storing a third value corresponding to the change in temperature; and adjusting, using the third value, the oscillator tuning circuit in response to the first change in power.

16. The method of claim 10, wherein the first value is a frequency offset caused by the first change in power.

17. The method of claim 10, wherein the first value is a difference in capacitance seen by the oscillator caused by the first change in power, and wherein a capacitance of the oscillator tuning circuit is subtracted by the first value to adjust the oscillator tuning circuit in response to the first change in power.

18. The method of claim 10, further comprising:
measuring a third value corresponding to a third change in capacitance seen by the oscillator, wherein the third change in capacitance is initiated by:
the first change in power to the first portion of the load circuit, and
the second change in power to the second portion of the load circuit;
storing the third value; and
adjusting, using the third value, the capacitance of the oscillator tuning circuit in response to:
the first change in power to the first portion of the load circuit, and
the second change in power to the second portion of the load circuit.

19. An oscillator circuit comprising:
an oscillator having an oscillation frequency;
a first clock buffer circuit coupled to the oscillator;
a second clock buffer circuit coupled to the oscillator;
a register configured to:
store a first value corresponding to a first change in capacitance of the first clock buffer circuit seen by the oscillator, wherein the first change in capacitance is initiated by a first change in power of the first clock buffer circuit, and
store a second value corresponding to a second change in capacitance of the second clock buffer circuit seen by the oscillator, wherein the second change in capacitance is initiated by a second change in power of the second clock buffer circuit; and
a tuning circuit coupled to the oscillator, wherein the tuning circuit is configured to tune the oscillation frequency of the oscillator to a desired baseline frequency, wherein the tuning circuit is adjusted, based on a stored value, in response to the first change in power or the second change in power.

20. The oscillator circuit of claim 19, further comprising a controller, wherein the controller is configured to:
monitor the first clock buffer circuit, detect the first change in power, and initiate tuning the oscillation frequency based on the first value; and
monitor the second clock buffer circuit, detect the second change in power, and initiate tuning the oscillation frequency based on the second value.

21. The oscillator circuit of claim 19, wherein the first change in power and the second change in power are changes in power from an on-state to an off-state.

22. The oscillator circuit of claim 19, wherein the first change in power and the second change in power are changes in power from a standby state to an on-state.

* * * * *

UNITED STATES PATENT AND TRADEMARK OFFICE
CERTIFICATE OF CORRECTION

PATENT NO. : 8,354,890 B2
APPLICATION NO. : 12/914235
DATED : January 15, 2013
INVENTOR(S) : Yuyu Chang et al.

Page 1 of 1

It is certified that error appears in the above-identified patent and that said Letters Patent is hereby corrected as shown below:

In the Specifications

In column 9, line 14, please delete "capacitances" and insert -- capacitance is --.

Signed and Sealed this
Fourteenth Day of May, 2013

Teresa Stanek Rea
*Acting Director of the United States Patent and Trademark Office*